(12) United States Patent
Tang et al.

(10) Patent No.: US 9,905,492 B2
(45) Date of Patent: Feb. 27, 2018

(54) SYSTEM AND METHOD FOR GAS-PHASE PASSIVATION OF A SEMICONDUCTOR SURFACE

(71) Applicant: ASM IP Holding B.V., Almere (NL)

(72) Inventors: Fu Tang, Gilbert, AZ (US); Michael E. Givens, Scottsdale, AZ (US); Qi Xie, Lueven (BE); Petri Raisanen, Gilbert, AZ (US)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 15/397,319

(22) Filed: Jan. 3, 2017

(65) Prior Publication Data
US 2017/0117203 A1    Apr. 27, 2017

Related U.S. Application Data

(62) Division of application No. 13/941,216, filed on Jul. 12, 2013, now Pat. No. 9,558,931.

(60) Provisional application No. 61/676,829, filed on Jul. 27, 2012.

(51) Int. Cl.
| | |
|---|---|
| *H01L 23/31* | (2006.01) |
| *H01L 21/02* | (2006.01) |
| *H01L 23/02* | (2006.01) |
| *H01L 21/67* | (2006.01) |
| *H01L 23/29* | (2006.01) |
| *H01L 21/306* | (2006.01) |
| *C23C 16/44* | (2006.01) |
| *C23C 16/455* | (2006.01) |

(52) U.S. Cl.
CPC ...... *H01L 23/3171* (2013.01); *C23C 16/4405* (2013.01); *C23C 16/45544* (2013.01); *H01L 21/0228* (2013.01); *H01L 21/02178* (2013.01); *H01L 21/02205* (2013.01); *H01L 21/02274* (2013.01); *H01L 21/02301* (2013.01); *H01L 21/02312* (2013.01); *H01L 21/306* (2013.01); *H01L 21/67011* (2013.01); *H01L 23/02* (2013.01); *H01L 23/29* (2013.01); *H01L 23/293* (2013.01); *H01L 2924/0002* (2013.01)

(58) Field of Classification Search
CPC ......................... H01L 23/3171; C23C 16/4405
USPC ............................................ 438/542; 257/27
See application file for complete search history.

(56) References Cited

U.S. PATENT DOCUMENTS

| | | | | |
|---|---|---|---|---|
| 5,559,046 | A * | 9/1996 | Oishi | H01L 23/4821 257/E23.013 |
| 2005/0092247 | A1* | 5/2005 | Schmidt | C23C 16/45512 118/715 |
| 2006/0099782 | A1* | 5/2006 | Ritenour | H01L 21/28255 438/542 |
| 2011/0089469 | A1* | 4/2011 | Merckling | H01L 21/28264 257/201 |
| 2014/0027884 | A1* | 1/2014 | Tang | H01L 23/293 257/632 |

\* cited by examiner

*Primary Examiner* — Bo Fan
(74) *Attorney, Agent, or Firm* — Snell & Wilmer L.L.P.

(57) ABSTRACT

Improved methods and systems for passivating a surface of a high-mobility semiconductor and structures and devices formed using the methods are disclosed. The method includes providing a high-mobility semiconductor surface to a chamber of a reactor and exposing the high-mobility semiconductor surface to a gas-phase sulfur precursor to passivate the high-mobility semiconductor surface.

10 Claims, 6 Drawing Sheets

SYSTEM AND METHOD FOR GAS-PHASE PASSIVATION OF A SEMICONDUCTOR SURFACE

CROSS REFERENCE TO RELATED APPLICATION

This application is a divisional application of U.S. application Ser. No. 13/941,216, entitled SYSTEM AND METHOD FOR GAS-PHASE SULFUR PASSIVATION OF A SEMICONDUCTOR SURFACE, filed Jul. 12, 2013, which claims the benefit and priority of Provisional Application No. 61/676,829, filed on Jul. 27, 2012, entitled SYSTEM AND METHOD FOR GAS-PHASE SULFUR PASSIVATION OF A SEMICONDUCTOR SURFACE; the contents of said applications are hereby incorporated by reference to the extent the contents do not conflict with the present disclosure.

FIELD OF INVENTION

The disclosure generally relates to methods and systems used to manufacture semiconductor devices and to devices formed using the systems and methods. More particularly, exemplary embodiments of the present disclosure relate to systems and methods for gas-phase sulfur passivation of a semiconductor surface.

BACKGROUND OF THE DISCLOSURE

High-mobility semiconductors, such as germanium and compound semiconductors (e.g., III-V compound semiconductors) may be desirable to use in the fabrication of semiconductor devices because of their relatively high electron and/or hole mobility. Devices formed with high-mobility semiconductor material may theoretically exhibit better performance, faster speeds, reduced power consumption, and have higher breakdown fields compared to similar devices formed with a lower-mobility semiconductor, such as silicon.

High-mobility semiconductor materials may be used, for example, to fabricate metal oxide field effect (MOSFET) devices. A typical MOSFET device includes a source region, a drain region, and a channel region, each formed of semiconductor material. The MOSFET also includes a dielectric material (gate dielectric) and conductive material (e.g., metal) overlying the channel region. The dielectric material and conductive material are formed by depositing the respective materials using vacuum or gas-phase deposition techniques, such as chemical vapor deposition, plasma-enhanced chemical vapor deposition, atomic layer deposition, physical vapor deposition, or the like.

Unfortunately, the interface between the channel region of the device, formed of high-mobility semiconductor materials such as germanium or III-V semiconductor materials, and the gate dielectric (e.g., high dielectric constant (k) materials) typically includes a large interface trap density ($D_{it}$). The high $D_{it}$ values are thought to result from vacancies and dangling bonds at the surface of the high-mobility semiconductor material, and the high $D_{it}$ values deleteriously affect the performance of devices formed with the high-mobility materials and have been a technical challenge to the development of complementary metal oxide semiconductor (CMOS) devices using such high-mobility semiconductor materials.

Various approaches to passivate a high mobility semiconductor surface prior to dielectric deposition, in order to achieve reduced interface trap densities, have been tried. For example, III-V semiconductor materials passivated with sulfur by immersing the materials in wet chemical $(NH_4)_2S$ solutions have shown improved interface properties, resulting in improved device performance. However, the immersion based passivation process is difficult to integrate into a vacuum or gas-phase deposition system used for subsequent dielectric material deposition. Consequently, there is an undesired air exposure time following sulfur passivation using wet chemical solution techniques and prior to the subsequent deposition of the dielectric material. This air exposure can severely affect the device performance, since the passivation layer cannot fully prevent oxide regrowth during this exposure, and oxide growth on germanium and III-V semiconductor surfaces generally increases $D_{it}$. Additionally, performing solution-based passivation at elevated temperatures (e.g., >100° C.) is problematic; thus, the reactivity of $(NH_4)_2S$ is limited.

Accordingly, improved methods and systems for passivating a surface of high-mobility semiconductor materials and devices formed using the methods and systems are desired.

SUMMARY OF THE DISCLOSURE

Various embodiments of the present disclosure provide improved systems and methods for passivating a surface of a semiconductor using a gas-phase sulfur precursor (which may originate as a solid, liquid, or gas phase) and devices formed using the systems and/or methods. While the ways in which the various drawbacks of the prior art are discussed in greater detail below, in general, the systems and methods can be used to fabricate semiconductor devices, using high-mobility semiconductor materials, with relatively low $D_{it}$ values.

In accordance with various embodiments of the disclosure, a system includes a vacuum and/or gas-phase (e.g., an atmospheric gas-phase) reactor and a sulfur precursor source in fluid communication with the reactor, wherein the sulfur precursor source provides a gas-phase sulfur precursor within a reaction chamber of the reactor.

In accordance with further embodiments of the disclosure, a method of passivating a surface of a high-mobility semiconductor includes the steps of providing the semiconductor surface to a chamber of a reactor, exposing the surface of the high-mobility semiconductor to a gas-phase sulfur precursor, and passivating the surface of the high-mobility semiconductor using the gas-phase sulfur precursor to form a passivated high-mobility semiconductor surface.

In accordance with yet further embodiments of the disclosure, a device is formed using a system including a vacuum and/or gas-phase reactor and a sulfur precursor source fluidly coupled to the reactor, wherein the sulfur precursor source provides a gas-phase sulfur precursor within a reaction chamber of the reactor.

And, in accordance with additional embodiments, a device is formed using a method that includes exposing a high-mobility semiconductor surface to a gas-phase sulfur precursor within a reaction chamber of a reactor.

Both the foregoing summary and the following detailed description are exemplary and explanatory only and are not restrictive of the disclosure.

BRIEF DESCRIPTION OF THE DRAWING FIGURES

A more complete understanding of the embodiments of the present disclosure may be derived by referring to the detailed description and claims when considered in connection with the following illustrative figures.

It will be appreciated that elements in the figures are illustrated for simplicity and clarity and have not necessarily been drawn to scale. For example, the dimensions of some of the elements in the figures may be exaggerated relative to other elements to help to improve the understanding of illustrated embodiments of the present disclosure.

DETAILED DESCRIPTION OF EXEMPLARY EMBODIMENTS OF THE INVENTION

The description of exemplary embodiments of systems, methods, and devices provided below is merely exemplary and is intended for purposes of illustration only; the following description is not intended to limit the scope of the disclosure. Moreover, recitation of multiple embodiments having stated features is not intended to exclude other embodiments having additional features or other embodiments incorporating different combinations of the stated features.

As set forth in more detail below, the systems and methods described herein can be used to passivate a surface of a semiconductor (e.g., a high mobility semiconductor, such as germanium (Ge) or III-V semiconductor). As used herein, "surface" means any portion of an exposed semiconductor surface. For example, the surface may be the entire exterior of a semiconductor wafer and/or layer or a portion thereof or a top surface of a semiconductor wafer and/or layer thereon or a portion of either.

Figure 1:
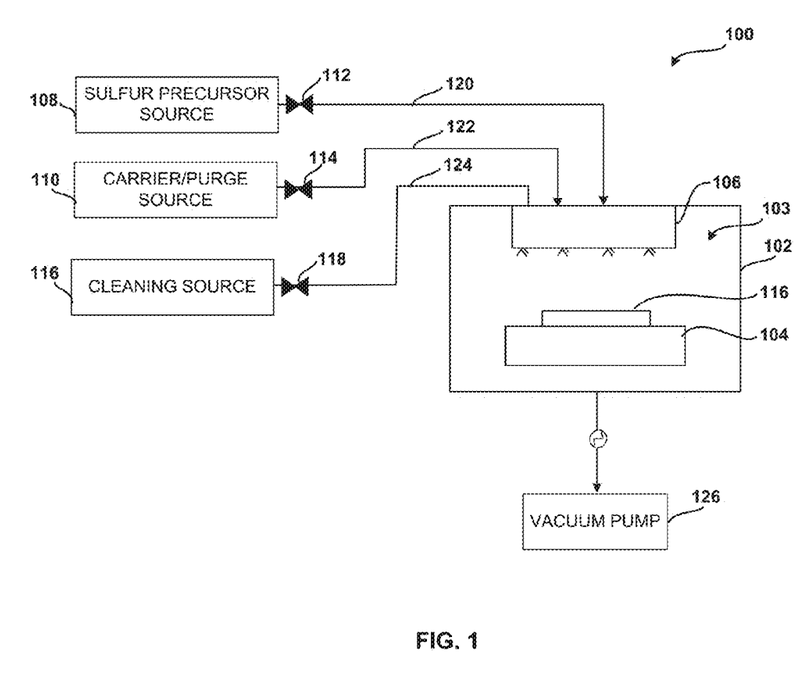
FIG. 1 illustrates an exemplary system in accordance with various exemplary embodiments of the disclosure.

Turning now to FIG. 1, a system 100 for passivating a semiconductor surface is illustrated. System 100 includes a reactor 102, including a reaction chamber 103, a substrate holder 104, and a gas distribution system 106; a sulfur precursor source 108; a carrier or purge gas source 110; and valves 112, 114 interposed between the sources 108, 110 and reactor 102.

Reactor 102 may be a standalone reactor or part of a cluster tool. Further, reactor 102 may be dedicated to a surface passivation process as described herein, or reactor 102 may be used for other processes—e.g., for layer deposition and/or etch processing. For example, reactor 102 may include a reactor typically used for chemical vapor deposition (CVD) and/or atomic layer deposition (ALD) processing, and may include direct plasma, and/or remote plasma apparatus. Using a plasma during the passivation process may enhance the reactivity of the sulfur precursor. Further, reactor 102 may operate under a vacuum or near atmospheric pressure. By way of one example, reactor 102 includes a reactor suitable for subsequent ALD deposition of a dielectric material onto substrate 116. An exemplary ALD reactor suitable for system 100 is described in U.S. Pat. No. 8,152,922, the contents of which are hereby incorporated herein by reference, to the extent such contents do not conflict with the present disclosure.

Substrate holder 104 is designed to hold substrate or workpiece 116, having a semiconductor surface, in place during processing. In accordance with various exemplary embodiments, holder 104 may form part of a direct plasma circuit. Additionally or alternatively, holder 104 may be heated, cooled, or be at ambient process temperature during processing.

Although gas distribution system 106 is illustrated in block form, gas distribution system 106 may be relatively complex and designed to mix vapor (gas) from sulfur precursor source 108 and carrier/purge gas from one or more sources, such as gas source 110, prior to distributing the gas mixture to remainder of reactor 102. Further, system 106 may be configured to provide vertical (as illustrated) or horizontal flow of gasses to the semiconductor surface. An exemplary gas distribution system is described in U.S. Pat. No. 8,152,922.

Sulfur precursor source 108 may be a liquid, solid, or gas source of sulfur-containing material suitable for passivating a semiconductor surface. If sulfur precursor source 108 is liquid or solid, the source material is vaporized prior to entering reaction chamber 103. Exemplary sulfur precursors for source 108 include $(NH_4)_2S$ solution ($(NH_4)_2S$ in aqueous solution—e.g., 22% solution), $H_2S$ gas, $NH_4HS$ solid, and organosulfur compounds, such as thiourea, $SC(NH_2)_2$.

Sulfur precursor 108 may be used to passivate a variety of semiconductor material surfaces. For example, the precursor may be used to passivate doped or undoped high mobility semiconductors, such as germanium, and III-V semiconductors, such as GaAs, InGaAs, other III-V semiconductors including Ga and/or As, and other III-V materials. By way of example, system 100 may be used to passivate a semiconductor surface including doped or undoped InGaAs, such as $In_{0.53}Ga_{0.47}As$.

Carrier or purge gas source 110 may include any suitable carrier gas suitable for mixing with the sulfur precursor from source 108 and/or any gas suitable for purging reactor 102 before and/or after sulfur passivation of the semiconductor surface. In accordance with exemplary embodiments of the disclosure, a purge gas may be nitrogen, argon, helium, or a combination thereof. The carrier gas may be nitrogen, argon, helium, or a combination thereof.

System 100 may also include a cleaning source 116, which includes solid, liquid, or gas phase chemicals to clean the semiconductor surface prior to passivation. For example, source 116 may include chemicals, which are gas-phase when entering chamber 113, to remove native oxides from the semiconductor surface. Exemplary chemicals suitable for source 116 include HCl, HF, $NH_4OH$, $H_2$, and hydrogen plasma.

As illustrated in FIG. 1, sources 108, 110, and 116 are in fluid communication with reactor 102 via valves 112, 114, and 118, which may be used to control the flow, mixing, and distribution of the respective source materials to reactor 102 using supply lines 120-124.

During a semiconductor surface passivation process, wafer or workpiece 116 is placed in chamber 103 of reactor 102, and reactor 102 is brought to a desired pressure (e.g., about 1 to about 10 Torr) using vacuum pump 126. Sulfur precursor material from source 108 is introduced into the reaction chamber 103 of reactor 102. If desired, carrier gas from source 110 may be mixed with the sulfur precursor— e.g., using gas distribution system 106, prior to the sulfur precursor entering chamber 103.

The passivation process conditions may vary according to a number of factors, including, for example, a substrate size, a substrate type, prior substrate processing steps, a type of reactor, a size of the reactor, and the sulfur precursor. Table 1 below illustrates exemplary process conditions for thermal and plasma passivation processes.

TABLE 1

| CONDITIONS FOR THERMAL TREATMENT | | | | |
|---|---|---|---|---|
| Temperature ° C. | Sulfur source (e.g., $(NH_4)_2S$ solution) vapor flux to reaction chamber (sccm) | Sulfur precursor (e.g., $(NH_4)_2S$) solution vapor concentration in reaction chamber (%) | Reaction chamber pressure (Torr) | Treatment time(s) |
| Room temperature (RT)-350 or RT-400 | 100-4000 | 5-90 or 5-95 | 0.5 to atmospheric (e.g., 760) or 1-10 | 1-600 |

| CONDITIONS FOR PLASMA TREATMENT | | | | | |
|---|---|---|---|---|---|
| Temperature ° C. | Sulfur source (e.g., $(NH_4)_2S$ solution) vapor flux to reaction chamber (sccm) | Sulfur precursor (e.g., $(NH_4)_2S$) solution vapor concentration in reaction chamber (%) | Reaction chamber pressure (Torr) | Plasma Treatment time(s) | Plasma Power (W) |
| RT-350 or RT to 400 | 100-4000 | 5-90 or 5-95 | 0.5-10 or 1-10 | 0.1-600 | 25-1000 |

A temperature of the passivation process may be the same as a temperature used for subsequent processing of workpiece 116 (e.g., deposition of a dielectric material, such as a high dielectric constant material), in which case, the passivation process and dielectric material deposition process may take place in the same reactor/chamber. Performing both steps in the same reactor may be advantageous, because the subsequent deposition can be performed without breaking the vacuum conditions; thus workpiece 116 exposure to air or an oxidizing environment can be reduced. However, the passivation process can be performed in a separate chamber, and using a separate chamber may be desirable if the process temperature of the passivation process is different from the temperature used for subsequent workpiece 116 processing.

The method may also include depositing dielectric material, such as high-k dielectric material onto the passivated semiconductor surface, which, as noted above, can be done in the same reactor or a different reactor as the gas-phase passivation process. If done in separate reactors, the reactors may or may not be part of the same cluster tool.

Exemplary high-k materials that may be deposited onto the passivated surface include forms of metallic oxides with dielectric constants (k values) greater than about 7. Such materials include magnesium oxide (MgO), aluminum oxide ($Al_2O_3$), zirconium oxide ($ZrO_2$), hafnium oxide ($HfO_2$), hafnium silicon oxide (HfSiO), tantalum oxide ($Ta_2O_5$), tantalum silicon oxide (TaSiO), barium strontium titanate (BST), strontium bismuth tantalate (SBT), and lanthanide oxides, oxides of physically stable "rare earth" elements as scandium (Sc), yttrium (Y), lanthanum (La), cerium Ce, praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb) and lutetium (Lu), as well as silicon nitride (SiN).

Using a gas-phase passivation process has several advantages compared to wet solution passivation processes. For example, the exposure to air between passivation and deposition of the dielectric material can be significantly reduced or eliminated or nearly eliminated using a gas-phase process. As a result, devices with much lower $D_{it}$ values and consequently better performance can be made using the techniques and system described herein.

SPECIFIC EXAMPLES

The following non-limiting examples illustrate a process of passivating a surface of high-mobility semiconductor material and a device or structure formed using the process. These examples are merely illustrative, and it is not intended that the disclosure be limited to the examples.

Comparative Example 1

An n-doped $In_{0.53}Ga_{0.47}As$ semiconductor surface was epitaxially grown over a two inch InP substrate. The native oxide on the $In_{0.53}Ga_{0.47}As$ surface was removed using a diluted HCl solution (37% HCl diluted×10 with deionized water) at room temperature for about sixty seconds. The samples were then rinsed twice with deionized water for 15 seconds/rinse and dried with a nitrogen gun. The surface was passivated by immersing the workpiece in a liquid solution of $(NH_4)_2S$.

An ALD $Al_2O_3$ layer was then deposited onto the passivated workpiece surface using trimethylaluminium (TMA) and $H_2O$ as the precursors. The thickness of the $Al_2O_3$ layer was about 1 nm for XPS analysis and about 5 nm for electrical characterization samples. For the samples used for electrical characterization, the dielectric material was annealed at about 400° C. for about five minutes in a 10% hydrogen in nitrogen environment.

Example 1

An n-doped $In_{0.53}Ga_{0.47}As$ semiconductor surface was epitaxially grown over a two inch InP substrate. The native oxide on the $In_{0.53}Ga_{0.47}As$ surface was removed using a diluted HCl solution as set forth in the Comparative Example, and the samples were loaded into a reactor chamber within five minutes of completing the clean, to control an amount of time the surface was exposed to ambient air.

The surface was passivated with sulfur by exposing the surface to a mixture of carrier gas (nitrogen) and a sulfur precursor source (22% $(NH_4)_2S$ solution source). The reactor chamber temperature was about 300° C., the reaction time about 5 minutes, and the chamber pressure at about 4 Torr.

An in situ ALD $Al_2O_3$ layer was then deposited onto the passivated workpiece surface using TMA and $H_2O$ as the precursors, without breaking vacuum between the passivation and dielectric material deposition steps. The thickness of the $Al_2O_3$ layer was about 1 nm for XPS analysis and about 5 nm for electrical characterization samples. For the samples used for electrical characterization, the dielectric material was then annealed at about 400° C. for about five minutes in a 10% hydrogen in nitrogen environment.

Figure 2:
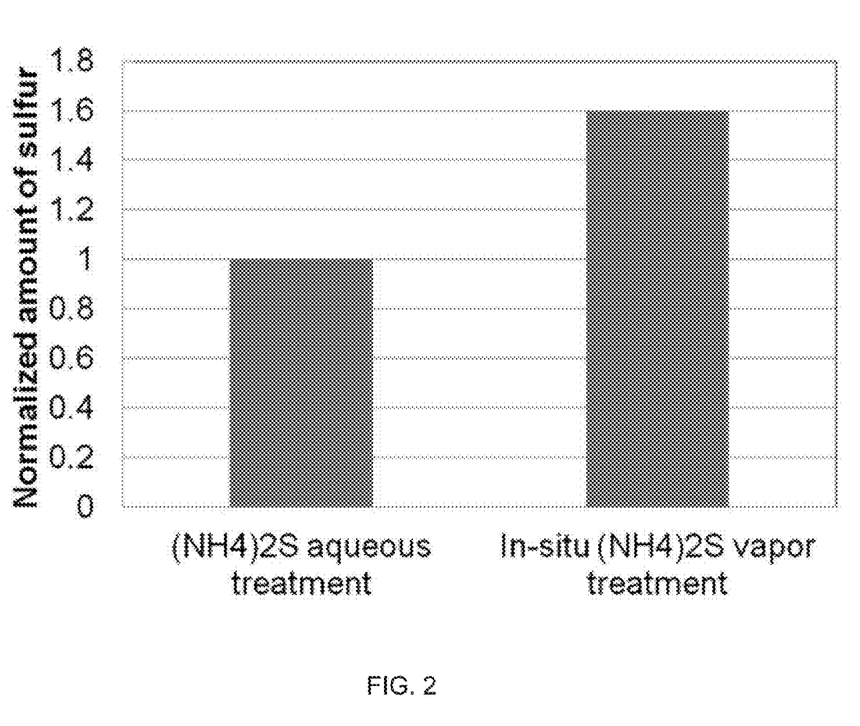
FIG. 2 illustrates a comparison of an amount of sulfur on a surface of high-mobility semiconductor surfaces treated with gas-phase and aqueous-phase passivation processes.

FIG. 2 illustrates XPS analysis of the samples, showing that a greater amount of sulfur was detected on the semiconductor surfaces of workpieces processed using the in situ vapor passivation process, compared to semiconductor surfaces treated with an aqueous immersion passivation process.

Figure 3A:
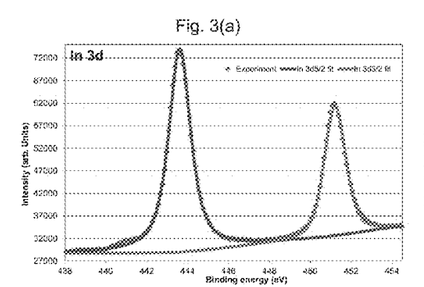
FIGS. 3(a)-3(c) illustrate XPS graphs of a semiconductor surface passivated with a gas-phase sulfur precursor.
Figure 3B:
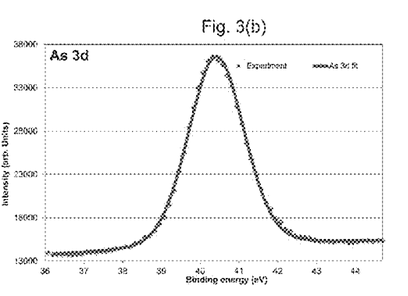
Figure 3C:
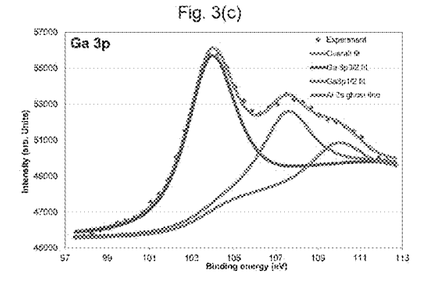

FIGS. 3(a)-(c) illustrate XPS analysis results of 1 nm of $Al_2O_3$ deposited on $In_{0.53}Ga_{0.47}As$ using the in situ sulfur vapor treatment of Example 1. In particular, FIG. 3(a) illustrates a single peak indium 3d; FIG. 3(b) illustrates a single peak for arsenic 3d; and FIG. 3(c) illustrates multiple XPS peaks for gallium 3p, all of which indicate a lack of oxygen at the interface between the semiconductor surface and the dielectric layer.

Example 2

An n-doped $In_{0.53}Ga_{0.47}As$ semiconductor surface was epitaxially grown over a two inch InP substrate. The native oxide on the $In_{0.53}Ga_{0.47}As$ surface was removed using a diluted HCl solution as set forth in the Example 1. The surface was passivated by ex situ $(NH_4)_2S$ vapor. An ALD $Al_2O_3$ layer was then deposited onto the passivated workpiece surface using TMA and $H_2O$ as the precursors. The thickness of the $Al_2O_3$ layer was about 1 nm for XPS analysis and about 5 nm for electrical characterization samples. For the samples used for electrical characterization, the dielectric material was then annealed at about 400° C. for about five minutes in a 10% hydrogen in nitrogen environment.

Figure 4A:
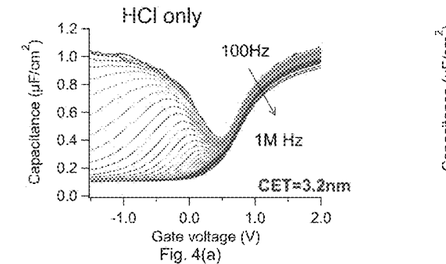
FIGS. 4(a)-4(d) illustrate capacitance-voltage characteristics of structures including passivated and non-passivated high-mobility semiconductor surfaces.
Figure 4B:
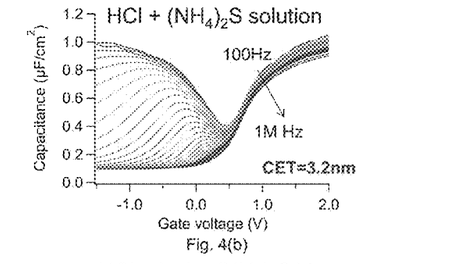
Figure 4C:
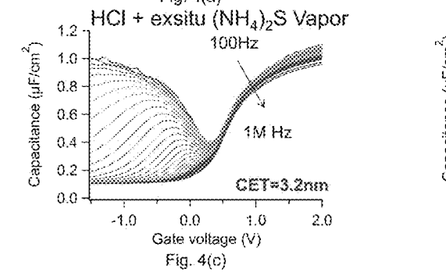
Figure 4D:
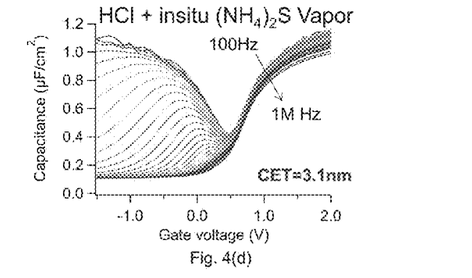

FIGS. 4(a)-4(c) illustrate improved frequency dispersion capacitance-voltage (C-V) characteristic of the devices formed in accordance with Examples 1 and 2, compared to the Comparative Example and to samples with no passivation. The C-V dispersion measurements were performed over frequencies in the range of about 100 Hz to about 1 MHz at room temperature and at 77 K to extract trap densities.

Table 2 lists the capacitance dispersion at the depletion and accumulation regions of structures/devices formed using no passivation and the processes of the Comparative Example and Examples 1 and 2. All passivated samples exhibit improved properties compared to the samples with no passivation. The ex-situ vapor passivation treatment exhibits the lowest dispersion while the in-situ vapor and solution-based passivation treatments yield slightly higher values. In order to map the interface state across the bandgap, CV curves were generated at temperatures down to 77 K. Table 3 shows the $D_{it}$ values at the mid gap and conduction band edge. The $D_{it}$ values listed in Table 3 were extracted by using conduce method at 300 K (near mid-gap) to 77 K (close to band edge). The $D_{it}$ values of passivated samples are reduced to a level on the order of $1E12/cm^2$ eV. These low values of $D_{it}$ are expected to yield high mobility transistor devices with better performance.

TABLE 2

| Treatment | Capacitance Dispersion (% Decade) | |
|---|---|---|
| | Strong Accumulation | Depletion |
| No Passivation | 3.19 | 7.1 |
| Comparative Example 1 | 3.09 | 4.86 |
| Example 2 | 2.8 | 2.76 |
| Example 1 | 3.41 | 4.57 |

TABLE 3

| Samples | $D_{it}$ at midgap | $D_{it}$ near band edge |
|---|---|---|
| No Passivation | $2.1\ e^{12}(/cm^2eV)$ | $2\ e^{12}(/cm^2eV)$ |
| Example 2 | $1.5\ e^{12}(/cm^2eV)$ | $2.5\ e^{11}(/cm^2eV)$ |
| Comparative Example 1 | $1.5\ e^{12}(/cm^2eV)$ | $5\ e^{11}(/cm^2eV)$ |
| Example 1 | $1.8\ e^{12}(/cm^2eV)$ | $1\ e^{12}(/cm^2eV)$ |

Example 3

An n-doped $In_{0.53}Ga_{0.47}As$ semiconductor surface was epitaxially grown over a two inch InP substrate. The native oxide on the $In_{0.53}Ga_{0.47}As$ surface was removed using a diluted HCl solution as set forth in the Comparative Example, and the samples were loaded into a reactor chamber within five minutes of completing the clean, to control an amount of time the surface was exposed to ambient air.

The surface was passivated with sulfur by exposing the surface to a mixture of carrier gas (nitrogen) and a sulfur precursor source (22% $(NH_4)_2S$ solution source). The reactor chamber temperature was about 300° C., the reaction time about 5 minutes, and the chamber pressure at about 4 Torr.

An in situ ALD $Al_2O_3$ layer was then deposited onto the passivated workpiece surface using TMA and $H_2O$ as the precursors, without breaking vacuum between the passivation and dielectric material deposition steps. An in-situ layer of hafnium oxide was then formed overlying the aluminum oxide layer using $HfCl_4$ and water as precursors. The thickness of the $Al_2O_3$ layer was about 1 nm and the hafnium oxide layer thickness was about 3 nm. The samples were annealed at about 400° C. for about five minutes in a 10% hydrogen in nitrogen environment.

Example 4

Structures were prepared according to Example 3, except $H_2S$ in a nitrogen carrier gas was used to passivate the HCl-cleaned surface prior to the aluminum oxide and hafnium oxide deposition steps.

Figure 5A:
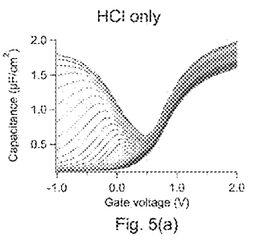
FIGS. 5(a)-5(c) illustrate additional capacitance-voltage characteristics of structures including passivated and non-passivated high-mobility semiconductor surfaces.
Figure 5B:
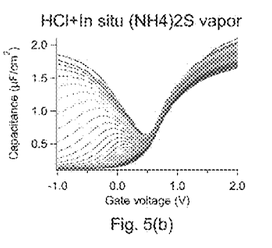
Figure 5C:
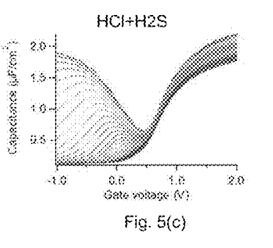

Table 4 below and FIGS. 5(a)-5(c) illustrate electrical characteristics of samples formed in accordance with Examples 3 and 4 and samples with an HCl-cleaned surface and no passivation treatment prior to the aluminum oxide and hafnium oxide deposition. As illustrated in FIGS. 5(b)-5(c), structures formed in accordance with Examples 3 and 4 exhibit improved frequency dispersion capacitance-voltage (C-V) characteristic, compared to sample with no passivation (FIG. 5(a)). The C-V dispersion measurements were performed and the $D_{it}$ values were extracted using the techniques described above. The $D_{it}$ values of passivated samples are reduced to a level about $1.8E12/cm^2$ eV (Example 3) and $1.6E12/cm^2$ eV (Example 4) or to about 60 percent (Example 3) and 53 percent (Example 4) of the $D_{it}$ of similarly formed structures without a passivation step. These low values of $D_{it}$ are expected to yield high mobility transistor devices with better performance.

TABLE 4

| Treatment | CET | $D_{it}$@midgap (/eVcm$^2$) | Dispersion in strong accumulation | CV hysteresis |
|---|---|---|---|---|
| HCl only | 1.7 nm | 3 e12 | 4.9%/dec | 100 mV |
| Example 3 | 1.6 nm | 1.8 e12 | 5%/dec | 60 mV |
| Example 4 | 1.6 nm | 1.6 e12 | 5%/dec | 50 mV |

Example 5

Structures in accordance with Example 5 were prepared using a method similar to the method used to form the structures of Example 4, except about 4 nm of aluminum oxide, rather than a combination of aluminum oxide and hafnium oxide, is deposited onto a cleaned surface.

Example 6

Similarly, structures in accordance with Example 6 were prepared using a method similar to the method used to form the structures of Example 3, except about 4 nm of aluminum oxide, rather than a combination of aluminum oxide and hafnium oxide, is deposited onto a cleaned surface.

Figure 6A:
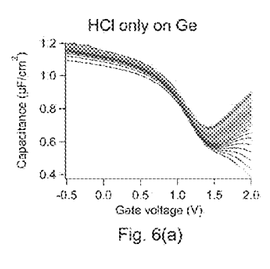
FIGS. 6(a)-6(c) illustrate additional capacitance-voltage characteristics of germanium structures including passivated and non-passivated surfaces.
Figure 6B:
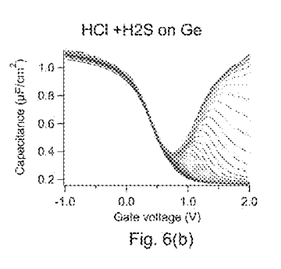
Figure 6C:
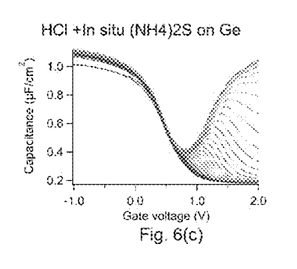

Table 5 below and FIGS. 6(a)-6(c) illustrate electrical characteristics of structures formed in accordance with Examples 5 and 6 and structures with an HCl-cleaned surface and no passivation treatment prior to the aluminum oxide deposition. As illustrated in FIGS. 6(b)-6(c), structures formed in accordance with Examples 5 and 6 exhibit improved frequency dispersion capacitance-voltage (C-V) characteristic, compared to a sample with no passivation (FIG. 6(c)). The C-V dispersion measurements were performed and $D_{it}$ values were obtained using the techniques described above. Table 5 shows the $D_{it}$ values at the mid gap were significantly reduced. The $D_{it}$ values are reduced to a level about $6.0E11/cm^2$ eV for structures formed in accordance with both Example 5 and Example 6, or to about 20 percent of the $D_{it}$ value of similarly formed structures without a passivation step. These low values of $D_{it}$ are expected to yield high mobility transistor devices with better performance

TABLE 5

| Treatment | CET | $D_{it}$@midgap (/eVcm$^2$) | Dispersion in strong accumulation | CV hysteresis |
|---|---|---|---|---|
| HCl only | 2.9 | <3.0 e12 | 0.8%/dec | 10 mV |
| Example 5 | 3.1 | 6.0 e11 | 1.1%/dec | 20 mV |
| Example 6 | 3.1 | 6.0 e11 | 1.0%/dec | 10 mV |

Although exemplary embodiments of the present disclosure are set forth herein, it should be appreciated that the disclosure is not so limited. For example, although the systems, methods, devices, and structures are described in connection with various process parameters, the disclosure is not so limited. Various modifications, variations, and enhancements of the system and method set forth herein may be made without departing from the spirit and scope of the present disclosure as set forth in the following claims and their equivalents.

What is claimed is:

1. A system for passivating a surface of a semiconductor, the system comprising:
   a reactor; and
   a sulfur precursor source consisting of NH$_4$HS fluidly coupled to the reactor,
   wherein the sulfur precursor source provides a gas-phase sulfur precursor to a reaction chamber of the reactor, and
   wherein a pressure within the reaction chamber is between 0.5 Torr and 750 Torr.

2. The system for passivating a surface of a semiconductor of claim 1, further comprising a cleaning source fluidly coupled to the reactor.

3. The system for passivating a surface of a semiconductor of claim 2, wherein the cleaning source is selected from the group consisting of HCl, HF, NH$_4$OH, H$_2$, and hydrogen plasma.

4. The system for passivating a surface of a semiconductor of claim 1, wherein the reactor comprises an atomic layer deposition reactor.

5. The system for passivating a surface of a semiconductor of claim 1, further comprising a plasma apparatus.

6. A structure formed using the method comprising the steps of:
   providing the surface of the semiconductor to a reaction chamber of a reactor;
   exposing the surface of the semiconductor to a gas-phase sulfur precursor consisting of NH$_4$HS in the reaction chamber; and
   passivating the surface of the semiconductor in the reaction chamber using the gas-phase sulfur precursor to form a passivated semiconductor surface,
   wherein the structure comprises a dielectric layer overlying the surface of the semiconductor, and
   wherein a pressure within the reaction chamber during the step of passivating is between 0.5 Torr and 750 Torr.

7. The structure of claim 6, wherein the structure exhibits a $D_{it}$ at midgap of less than about $1.8\ e^{12}$ (/cm$^2$ eV).

8. The structure of claim 6, wherein the structure exhibits a $D_{it}$ near a band edge of less than about $1\ e^{12}$ (/cm$^2$ eV).

9. The system for passivating a surface of a semiconductor of claim 2, wherein the cleaning source is selected from the group consisting of NH$_4$OH, H$_2$ and hydrogen plasma.

10. The system for passivating a surface of a semiconductor of claim 2, wherein the cleaning source is selected from the group consisting of H$_2$ and hydrogen plasma.

* * * * *